(12) United States Patent
Joe et al.

(10) Patent No.: US 6,452,530 B2
(45) Date of Patent: Sep. 17, 2002

(54) METHOD AND APPARATUS FOR A PULSE DECODING COMMUNICATION SYSTEM USING MULTIPLE RECEIVERS

(75) Inventors: Jurianto Joe; Kin M. Lye, both of Singapore (SG)

(73) Assignee: The National University of Singapore (SG)

( * ) Notice: Subject to any disclaimer, the term of this patent is extended or adjusted under 35 U.S.C. 154(b) by 8 days.

(21) Appl. No.: 09/834,977

(22) Filed: Apr. 13, 2001

Related U.S. Application Data

(63) Continuation-in-part of application No. 09/805,845, filed on Mar. 13, 2001, which is a continuation-in-part of application No. 09/429,527, filed on Oct. 8, 1999, now Pat. No. 6,259,390.

(51) Int. Cl.[7] .............................................. H03M 1/60
(52) U.S. Cl. ........................................ 341/157; 341/133
(58) Field of Search ................................. 341/133, 111, 341/157; 318/798; 330/284; 331/74; 322/154

(56) References Cited

U.S. PATENT DOCUMENTS

| | | | |
|---|---|---|---|
| 4,425,647 A | 1/1984 | Collins et al. ................. | 371/70 |
| 4,459,591 A | 7/1984 | Haubner et al. ....... | 340/825.57 |
| 5,892,701 A | * 4/1999 | Huang et al. ................ | 708/819 |
| 6,023,672 A | * 2/2000 | Ozawa ........................ | 704/222 |
| 6,259,390 B1 | 7/2001 | Joe ............................. | 341/133 |

OTHER PUBLICATIONS

Abell, E., "Gated Oscillator Emulates a Flip–Flop", EDN Access, pp. 1–2, Mar. 16, 1995.
James P. Keener, Analog Circuitry for the van der Pol and FitzHugh–Nagumo Equations, IEEE 1983, pp. 1011–1015.
Peter Konig, Image Segmentation Based on Oscillatory Correlation, Neural Computation 9, 1997, pp. 805–836.
Patarasen, S. et al., Maximum–Likelihood Symbol Synchronization and Detection of OPPM Sequeunces, IEEE Transactions on Communications, New York, US, Jun. 94, p. 9, vol. 42, No. 6.

* cited by examiner

*Primary Examiner*—Peguy Jeanpierre
(74) *Attorney, Agent, or Firm*—Townsend and Townsend and Crew LLP; Kenneth R. Allen

(57) ABSTRACT

A multiple receiver approach is disclosed for a pulse decoding communication system, which can enhance system robustness and increase information carrying capacity. Two or more receivers are used to produce groups of pulses from a received signal. In one embodiment, system robustness is enhanced by redundancy. In another embodiment, information capacity is increased by producing independent groups of pulses from one cycle of an analog waveform.

30 Claims, 6 Drawing Sheets

METHOD AND APPARATUS FOR A PULSE DECODING COMMUNICATION SYSTEM USING MULTIPLE RECEIVERS

CROSS REFERENCE TO RELATED APPLICATIONS

This application is a continuation-in-part of U.S. application Ser. No. 09/429,527 for METHOD AND APPARATUS FOR GENERATING PULSES FROM ANALOG WAVEFORMS, filed Oct. 28, 1999, now U.S. Pat. No. 6,259,590 and U.S. application Ser. No. 09/805,845 for CIRCUITRY WITH RESISTIVE INPUT IMPEDANCE FOR GENERATING PULSES FROM ANALOG WAVEFORMS, filed Mar. 13, 2001, both of which are owned by the Assignee of the present invention, and are herein incorporated by reference for all purposes.

This application is related to co-pending U.S. application Ser. No. 09/429,519 for A METHOD AND APPARATUS FOR COMMUNICATION USING PULSE DECODING, filed Oct. 28, 1999 and to co-pending and co-owned U.S. application Ser. No. 09/805,854 for METHOD AND APPARATUS TO RECOVER DATA FROM PULSES, filed Mar. 13, 2001, both of which are owned by the Assignee of the present invention and are herein incorporated by reference for all purposes.

BACKGROUND OF THE INVENTION

This invention relates generally to a communication technique and more specifically to techniques for communication by converting arbitrary analog waveforms to sequences of pulses.

In co-pending, commonly owned U.S. application Ser. No. 09/429,519, the communication system illustrated in FIG. 1 shows that groups of pulses are supplied to a decoding (decision) device 14. The decoder disclosed therein recovers data from the pulses; for example, by counting pulses. Additional recovery techniques are disclosed in co-pending, commonly owned U.S. application Ser. No. 09/805,854.

It is desirable to increase the robustness of systems which employ the techniques disclosed in the foregoing identified applications. The utility of such systems can be further increased by increasing their information carrying capacity.

SUMMARY OF THE INVENTION

According to the invention, a method and apparatus for a communication circuit is provided to recover information in a received signal. The communication circuit comprises at least two receiver circuits. The received signal is fed to each receiver circuit. Each receiver circuit is configured in accordance with the invention to produce output comprising a group of one or more pulses in response to detecting some portion of the received signal. The output of each receiver is fed to a decision device, which produces one or more symbols.

In one embodiment of the invention, the groups of pulses from each receiver are processed by the decision device to produce a single symbol. In this embodiment of the invention, information transmission is more robust due to the redundancy of the information.

In another embodiment of the invention, the groups of pulses from each receiver are processed to produce a symbol from each such group, thereby enhancing information carrying capacity.

BRIEF DESCRIPTION OF THE DRAWINGS

The teachings of the present invention can be readily understood by considering the following detailed description in conjunction with the accompanying drawings.

DESCRIPTION OF THE SPECIFIC EMBODIMENTS

Figure 1:
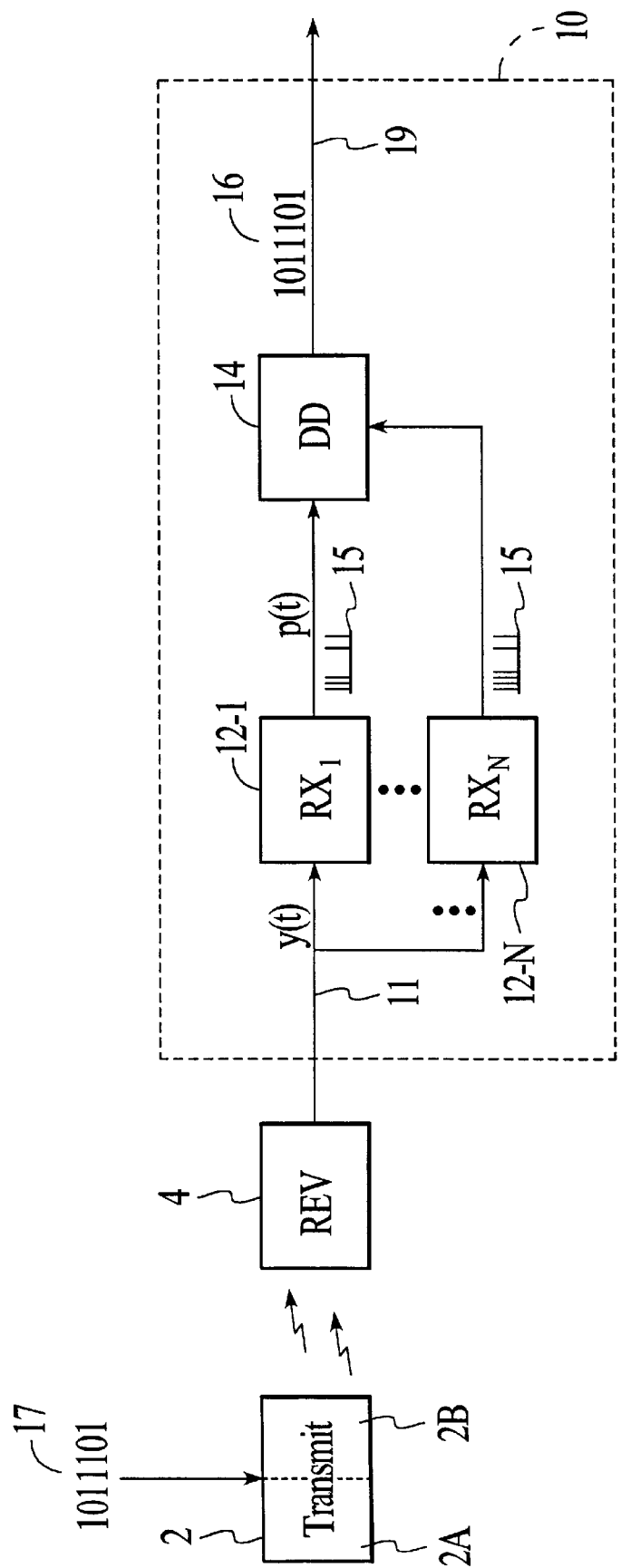
FIG. 1 shows an illustrative embodiment of the present invention.

Referring to FIG. 1, a communication system 10 incorporating the present invention is shown schematically. A transmitting unit 2 receives information 17 to be transmitted. In an illustrative embodiment of the invention, a waveform generator in the transmitting unit produces a plurality of analog waveforms representative of the symbols contained in the information. In accordance with the invention, each symbol has a corresponding waveform. The transmitting unit produces an analog waveform signal comprising individual analog waveforms representative of the individual symbols in the information. The analog waveform signal is transmitted to a receiver unit 4 over an appropriate transmission medium. The receiver unit produces the analog waveform signal as a received signal y(t).

The received signal y(t) is applied to an input 11, which feeds a number of receivers 12-1 . . . 12-N. As will be explained below, each receiver is configured to respond to the received signal by producing oscillatory output 15. The output of each receiver feeds into a decision device 14. The decision device produces a character (symbol) selected from an alphabet (e.g. an alphabet might comprises the 3-bit characters "000", "001", "010", "011", "100", "101", "110", and "111") as a function of the oscillatory outputs feeding into it. An output 19 of the decision device outputs the character. For example, in an illustrative embodiment of the invention, the decision device 14 simply counts the number of pulses in each group of pulses. Thus, for example, a pulse count of 1 can by definition represent the 3-bit character "000", a pulse count of 2 maps to the 3-bit character "001", and so on. Pulse counting circuits are known, and so no further discussion of such circuits is needed. Additional implementations for the decision device can be found in U.S. application Ser. No. 09/805,854. The specific implementation will depend on factors such as cost, performance, system complexity, circuit complexity, and so on; considerations which are not relevant to the practice of the present invention.

In another illustrated embodiment, the transmitter unit 2 comprises a waveform generating portion 2A to produce the foregoing analog waveform signal, and a modulation circuit 2B. In this particular embodiment, assume the analog waveform signal in and of itself is not appropriate for transmission. For example, if the communication system is a conventional radio transmission system then the analog waveform signal may have to be modulated onto a carrier signal as a practical matter. In such a case the modulation circuit might be a conventional radio modulation circuit. Accordingly, the receiver unit 4 might include a demodulation circuit to produce the analog waveform signal as received signal y(t).

In a simple embodiment of the invention, the communication from transmitter unit 2 to receiver unit 4 may be as simple as sending the analog waveform signal over a wire or wireless channel. In such a case, the receiver unit may simply be some sort of filter and amplifier circuit. A more sophisticated embodiment may require that the analog waveform signal be modulated in a suitable way to accommodate the transmission medium, and consequently demodulated. The method of transmission of the analog waveform signal is not relevant to the practice of the invention (e.g., whether modulation is required or not, and so forth). Any of a number of known transmission techniques can be used.

In one embodiment of the invention, the creation of the analog waveform signal occurs in a piecewise fashion. First, a set of symbols comprising the information is defined. This might be the binary code of "1" and "0". The symbol set might be an alphabet of two-bit binary characters, namely, "00", "01", "10", and "11". The symbol might be the alphabet of the English language, "a"–"z", and so on. For each symbol (character) at least one analog waveform is associated with it.

Next, information 17 (FIG. 1) is received. For each symbol, the waveform generating portion 2A of the transmitter unit 2 produces corresponding analog waveform. The analog waveforms might be digitized and the waveform generating portion might be a digital signal processor (DSP) which simply performs a table lookup to produce the analog waveform. Other conventional techniques are readily adapted to perform this function. The analog waveforms are combined to produce an analog waveform signal which constitutes the information 17 to be transmitted. In one embodiment of the invention, the individual analog waveforms associated with each symbol are ready for radio transmission.

Figure 10A:
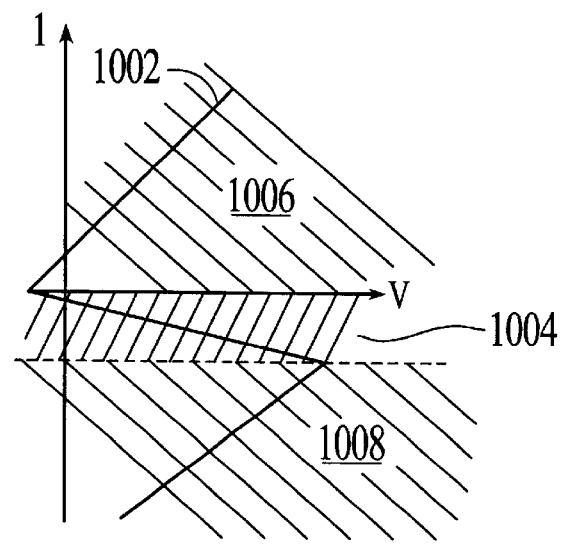
FIGS. 10A and 10B illustrate the two types of transfer functions used by the circuitry of the present invention.
Figure 10B:
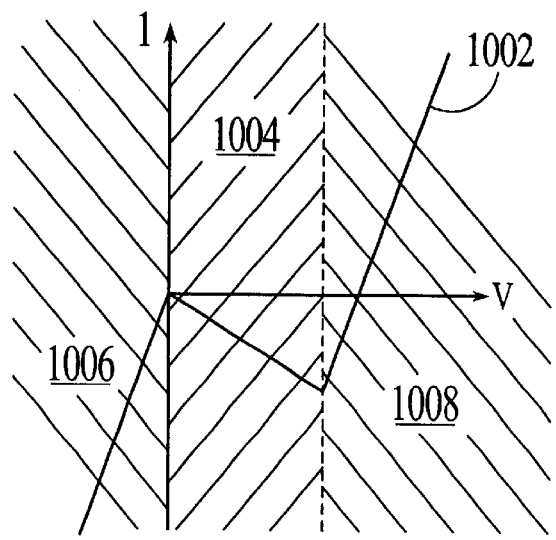

Referring to FIGS. 10A and 10B for a moment, the illustrative circuits disclosed in the present invention exhibit a transfer function having either an S-shaped appearance such as shown in FIG. 10A or the N-shaped appearance shown in FIG. 10B. For the purposes of the present invention, the "transfer function" of a circuit refers to the relationship between any two state variables of a circuit. Electronic circuits are typically characterized by their I-V curves, relating the two state variables of current and voltage. Such curves indicate how one state variable (e.g., current) changes as the other state variable (voltage) varies. As can be seen in FIGS. 10A and 10B, each transfer function 1002 includes a portion which lies within a region 1004, referred to herein as an "unstable" region. The unstable region is bounded on either side by regions 1006 and 1008, each of which is herein referred to as the "stable" region.

A circuit in accordance with the invention has an associated "operating point" which is defined as its location on the transfer function 1002. The nature of the output of the circuit depends on the location of its operating point. If the operating point is positioned along the portion of the transfer function that lies within region 1004, the output of the circuit will exhibit an oscillatory behavior. Hence, the region 1004 in which this portion of the transfer function is found is referred to as an unstable region. If the operating point is positioned along the portions of the transfer function that lie within either of regions 1006 and 1008, the output of the circuit will exhibit a generally time-varying but otherwise non-oscillatory behavior. For this reason, regions 1006 and 1008 are referred to as stable regions.

Figure 2:
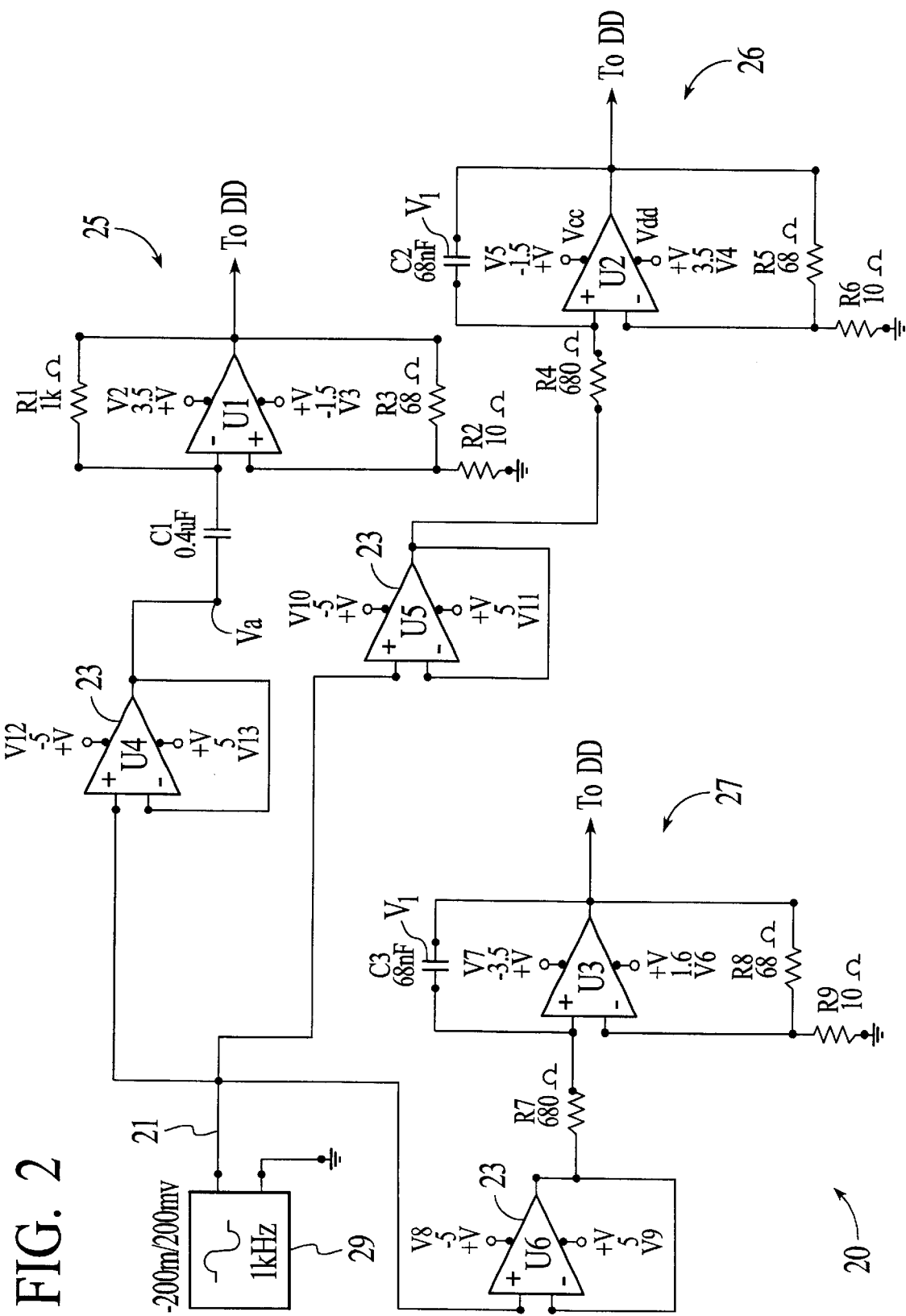
FIG. 2 shows illustrative circuits used as the receiving circuits shown in FIG. 1.

Turn now to FIG. 2 for an illustrative example of the communication circuit 20 according to the present invention. The circuit comprises three receiver circuits, 25–27. Each receiver circuit can be configured to respond to either the amplitude of the received signal y(t) or to the slope of the received signal. The output of each receiver circuit is applied to the decision device 14 (FIG. 1).

An input 21 to the communication circuit 20 is provided to receive signal y(t). The input is applied to each of three buffers, 23. There is one such buffer for each receiver, 25–27. The circuitry comprising the receivers are characterized by having stable and unstable regions as discussed above. More particularly, in one embodiment, the circuits have an unstable region bounded by two stable regions.

A first receiver 25 comprises an operational amplifier (op-amp) U1. In this particular embodiment, the op-amp is the readily available LM 7121 op-amp. The op-amp is configured with a negative feedback path comprising a resistive element R1 having a resistance of about 1 K$\Omega$. R1 couples the output of the op-amp to its negative input. An input signal feeds into the negative input through a capacitive element C1 having a capacitance of about 0.4 $\mu$F. A positive feedback path is provided by a voltage divider comprising a resistance of about 68 $\Omega$ in series with a resistance of about 10 $\Omega$. A $V_{cc}$ pin of the op-amp is coupled to +3.5 V and a $V_{dd}$ of the op-amp is coupled to −1.5 V.

A second receiver 26 includes an LM 7121 op-amp U2. The op-amp is configured with a positive feedback leg comprising a capacitive element C2 coupled between the op-amp output and the op-amp positive input. The capacitive element has a capacitance of about 68 nF. A negative feedback leg comprises a voltage divider configured from resistive elements R5 and R6, having resistances respectively of about 68 $\Omega$ and 10 $\Omega$. An input signal is coupled to the positive input via a resistive element R4 having a resistance of about 680 $\Omega$. A $V_{cc}$ pin of the op-amp is connected to −1.5 V and a $V_{dd}$ pin is connected to +3.5V.

A third receiver 27 is configured from an LM 7121 op-amp. A capacitive element having a capacitance of about 68 nF is coupled between the op-amp's output and its positive input. A voltage divider circuit connects the op-amp's output to its negative input. The voltage divider circuit comprises a resistive element R8 having a resistance of about 68 $\Omega$ and a resistive element R9 having a resistance of about 10 $\Omega$. An input is coupled through a resistive element R7 to the positive input of the op-amp. The resistive element R7 has a resistance of about 680 $\Omega$. The op-amp $V_{cc}$ pin is connected to −3.5V and the $V_{dd}$ pin is connected to +1.6V.

Additional circuits are disclosed in co-pending and commonly owned U.S. application Ser. No. 09/429,527, and in U.S. application Ser. No. 09/805,845 which are herein incorporated by reference for all purposes. The specific implementation for the receiver circuits will depend on factors such as cost, system complexity, circuit complexity, and so on; considerations which are not relevant to the practice of the present invention.

Receiver 25 is configured with an S-shaped transfer characteristic. As will be explained, such a receiver is responsive to the slope of an input analog signal applied to its input. More particularly, the receiver 25 is configured to be responsive to the negative slope of an input analog signal by generating groups of pulses.

Receiver 26 is configured to have an N-shaped transfer characteristic. As will be explained, such a receiver is sensitive to the amplitude of the input analog signal. More particularly, the receiver 26 is configured to respond to positive amplitude portions of an input analog signal by generating groups of pulses.

Receiver 27 is configured with an N-shaped transfer characteristic. In this particular illustrative embodiment, the receiver is configured to respond to negative amplitude portions of an incoming analog signal. Receiver 27 will generate groups of pulses only in response to the negative amplitude portions of an input signal.

Figure 8:
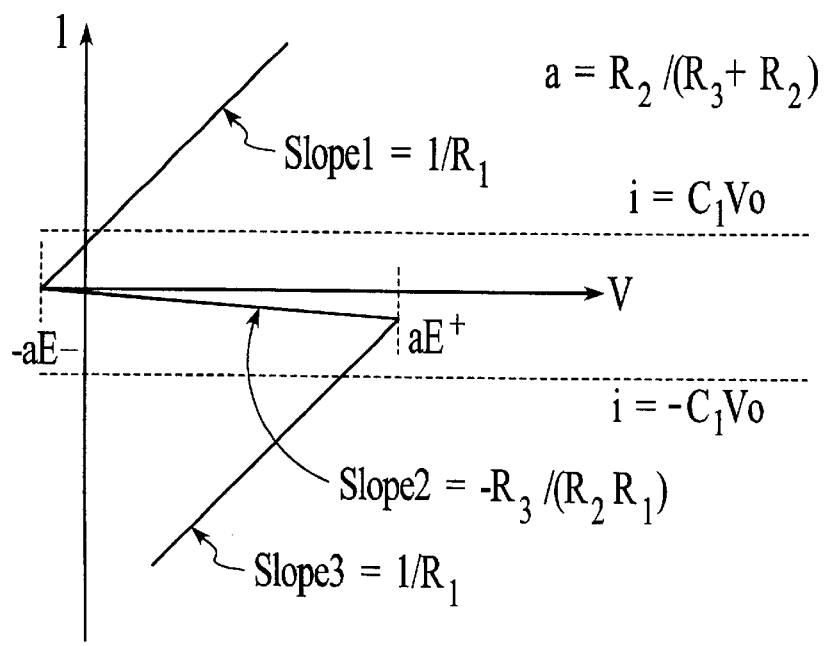
FIG. 8 shows an S-shaped transfer function according to the invention.

Refer for a moment to FIGS. 2 and 8. The receiver 25 has an S-shaped transfer function. The relation of V and i is expressed as $V=\Psi(i)$ when the rate change of i is zero. FIG. 8 shows the transfer function of the receiver circuit 25. The output saturation voltage of op-amp U1 is proportional to $E^+$ when the differential voltage $(V^+ - V^-)$ is greater than zero. Conversely, the output saturation voltage is proportional to $E^-$ when the differential voltage is less than zero.

The equations relating voltages $V_a$, $V_{cl}$, V, and current i are:

$$V_a = V_{cl} + V,\quad \text{Eqn. (1)}$$

$$\frac{dV}{dt} = \frac{dV_a}{dt} - \frac{i}{C},\text{ and}\quad \text{Eqn. (2)}$$

$$\lim_{L\to 0} L\frac{di}{dt} = V - \Psi(i),\quad \text{Eqn. (3)}$$

where L is a parasitic inductance which could be present in the form of a wire lead of a component, V is the voltage at the inverted input of the op-amp, i is the current flowing through R1, $V_a$ is the received signal, and $V_{cl}$ is the voltage across capacitive element C1.

The receiver circuit 25 has operating points of importance along the transfer function curve. These operating points are found by setting $dV/dt=0$ in Eqn. 2 and $di/dt=0$ in Eq. 3. As described above, $di/dt=0$ when $V=\Psi(i)$. To simplify the analysis, assume that $V_a$ is a triangular waveform source. The time derivative of this waveform source is equal to $\pm V_o$ where $V_o$ is a constant. Hence, the operating points occur at the intersection of $i=+CV_o$ and the piecewise linear function of the transfer function and at the intersection of $i=-CV_o$ and the piecewise linear function. If the operating point lies on either of the positive slope lines slope1 or slope3 as shown in FIG. 8 (i.e., the stable regions), the output of the circuit is non-oscillatory. However, if the operating point lies on the negative slope line slope2, namely the unstable region, a continuous "jumping" phenomenon will occur. In the time domain, this is seen as a series of oscillations at the output of the circuit. In other words, the operating points along slope1 and slope3 are stable operating points. On the other hand, the operating points along slope2 are unstable operating points. For the transfer function shown in FIG. 8, slope2 can only intersect with line $i=-CV_o$. This means that oscillations will be observed only when $dV_a/dt$ is negative. This is the case with receiver circuit 25, which is configured to be responsive to the negative slope of an applied signal. When $dV_a/dt$ is positive, no oscillatory activity is observed. By changing the negative slope of the arbitrary analog signal, the operating points can be moved ("forced") between the unstable and stable regions. This action produces periods of oscillatory and non-oscillatory behavior. Thus, for circuits having an S-shaped transfer function curve, it is the changing slope of the applied analog waveform that "forces" the circuit's operating point between stable and unstable region.

Figure 9:
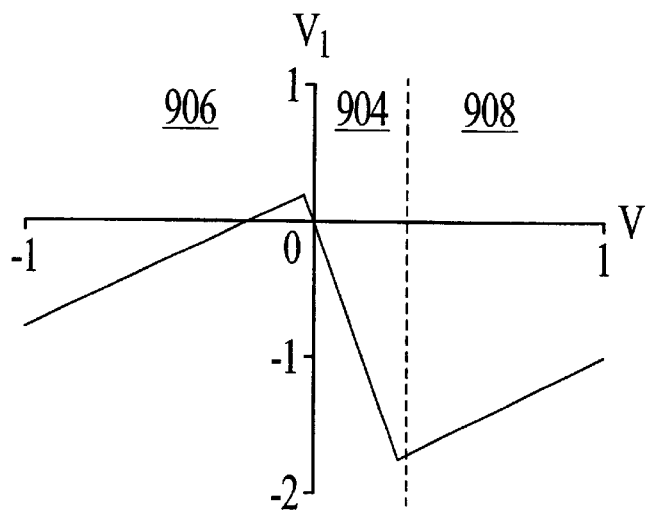
FIG. 9 shows an N-shaped transfer function according to the invention.

Refer now to FIGS. 2 and 9. Receiver 26 has a transfer function based on a relationship between two voltages $V_1$ and V. Receiver 26 is characterized by the N-shaped transfer function shown in FIG. 9, where V is the voltage at the op-amp non-inverted terminal, and $V_1$ is the voltage across the capacitor C2. The N-shaped transfer function of FIG. 9 shows an unstable region of operation 904 bounded by two stable regions of operation 906, 908.

The transfer function shown in FIG. 9 is obtained by properly biasing the op-amp through pins $V_{cc}$ and $V_{dd}$. Thus for receiver 26 in FIG. 2, $V_{cc}$ is set to $-1.5$ V and $V_{dd}$ is set at $+3.5$V. The unstable region is defined as a region where $dV_1/dV$ is negative and the stable region is defined as a region where $dV_1/dV$ is positive.

The governing equations for the receiver circuit 26 are the following:

$$V_1 = \Psi(V)\quad \text{Eqn. (4)}$$

$$C\frac{dV_1}{dt} = \frac{V_s - V}{R}\quad \text{Eqn. (5)}$$

Eqn. 4 represents the relation between $V_1$ and V. The operating point of the circuit can be obtained by setting $dV_1/dV$ to zero in Eqn. 5 and finding the intersection with $V_1=\Psi(V)$. By moving this operating point into and out of the unstable region 904 as explained above, a controlled relaxation oscillation behavior (unstable operation) will be observed. The behavior manifests itself in the form of groups of one or more pulses. In this particular case, the voltage $V_s$ is the amplitude of the analog waveform source 29 which controls the operating point. The analog waveform source represents a received signal from which the pulses will be extracted. Since the unstable region $dV1/dV<0$ is in the $V>0$ plane, then the circuit 26 will only oscillate in response to certain range of positive amplitudes of the analog waveform.

A similar N-shaped transfer function is obtained for receiver circuit 27, except that $V_{cc}$ and $V_{dd}$ are biased so that the receiver produces an oscillatory output during the negative amplitude portions of an input signal. Note that in this case, the unstable region $dV1/dV<0$ is in the $V<0$ plane. Hence, circuit 27 will only oscillate in response to certain range of negative amplitudes of the analog waveform.

Figure 3:
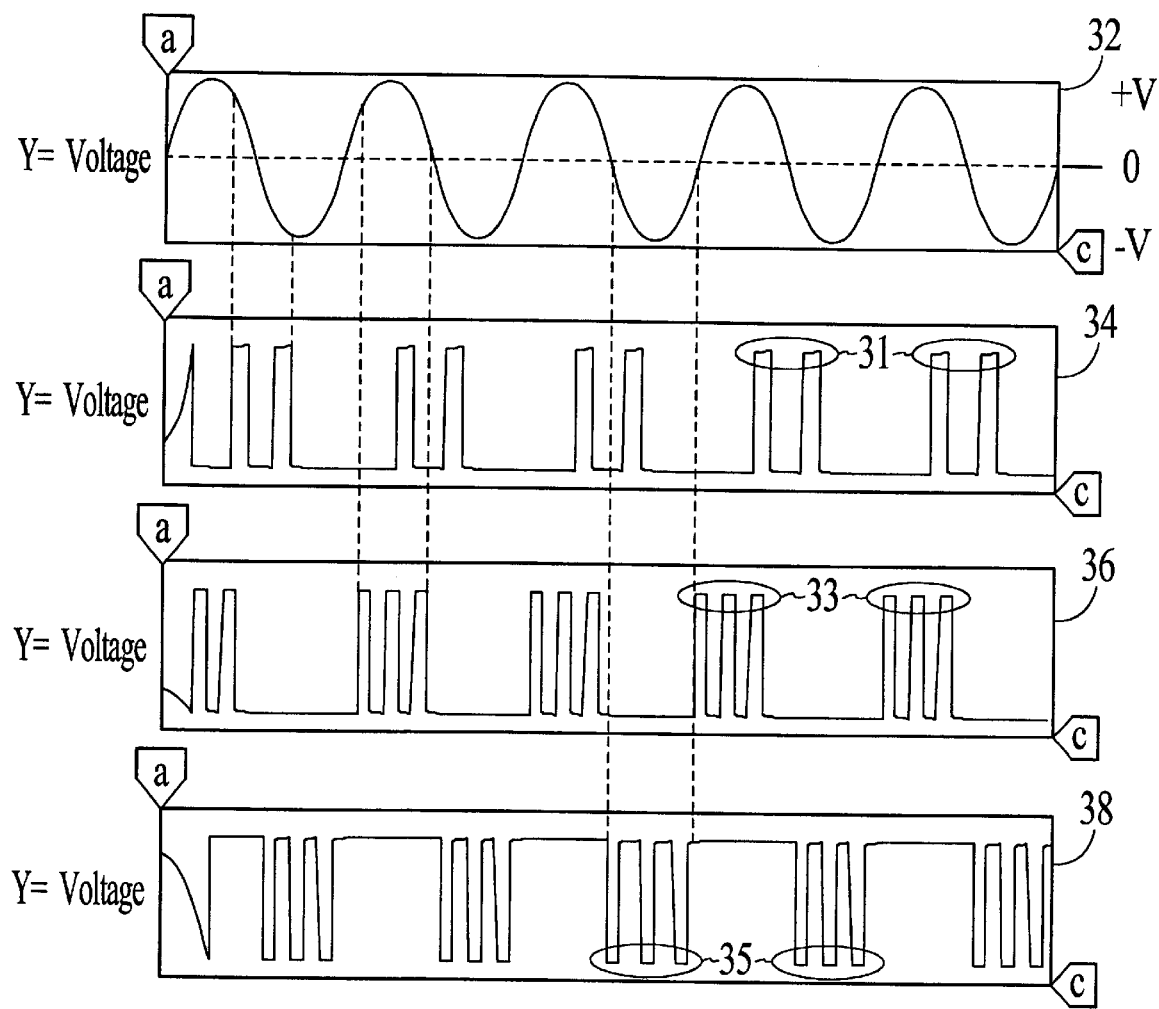
FIG. 3 shows traces produced by the circuits of FIG. 2.

Referring now to FIG. 3, experimental results are shown for the circuit 20 depicted in FIG. 2. For this experiment, a signal generator 21 represents the source of received signal y(t) (FIG. 1). The analog signal produced by the signal generator is fed to the receivers 25–27. Trace 32 shows the input analog waveform. Trace 34 is obtained at the output of receiver 25. Similarly, traces 36 and 38 are outputs of receivers 26 and 27, respectively.

As expected from the foregoing discussion, trace 34 shows that groups of pulses 31 are produced by receiver 25 only during the negative slope portions of the signal 32. Similarly, groups of pulses 33 are found in trace 36 during the positive amplitude portions of the input signal 32. As can be seen from trace 38, receiver 27 produces groups of pulses 35 during the negative amplitude portions of the input signal 32.

Referring now to FIGS. 1–3, the groups of pulses 15 are fed into a decision device 14. The decision device processes the groups of pulses to make a determination as to the character to be generated. In one embodiment of the invention, each cycle of the received signal represents a character from an alphabet; e.g. binary '0' and '1' are characters which constitute a binary alphabet. Another example is an alphabet comprising four two-bit characters, i.e., "00", "01", "10", and "11". The foregoing are merely examples to illustrate the operation of the present invention, and should not be construed as limiting the invention to the disclosed alphabets.

For each cycle of the received signal, each receiver 25–27 will produce a group of one or more pulses as illustrated in FIG. 3. The group of pulses produced by any given receiver is a priori assigned to a character in the alphabet. Since each cycle represents a character, each of the three groups of pulses produced by the three receivers should map to that character. Thus, the decision device 14, which receives the three groups of pulses, is provided with redundant information. Ideally, each group would map to the same character 'x', indicating with very high confidence that the character contained in the received signal is indeed the character 'x'. However, due to the effects of the transmission channel, the received signal y(t) may be distorted. In that case, the decision device may be presented with groups of pulses from the three receivers which do not map to the same character. The decision device must therefore make a "guess" using known techniques to decide what the character is. For example, a soft decision with some kind of weighting function applied to the number of pulses generated by each receiver might be used. In U.S. application Ser. No. 09/805,854, additional techniques are disclosed. By providing the decision device with multiple "views" of the received signal by way of the multiple receivers, a more accurate guess of the character can be made when a distorted signal is received. This particular embodiment of the present invention, therefore, is effective to enhance the robustness of a multiple receiver pulse decoding communication system.

In another embodiment of the invention, a multiple receiver pulse decoding communication system is configured to enhance information capacity. The pulse decoding system disclosed in co-pending and commonly owned U.S. application Ser. No. 09/429,527, comprises a single receiver. As such, the receiver is able to decode only one symbol for one cycle of analog waveform.

Figure 4:
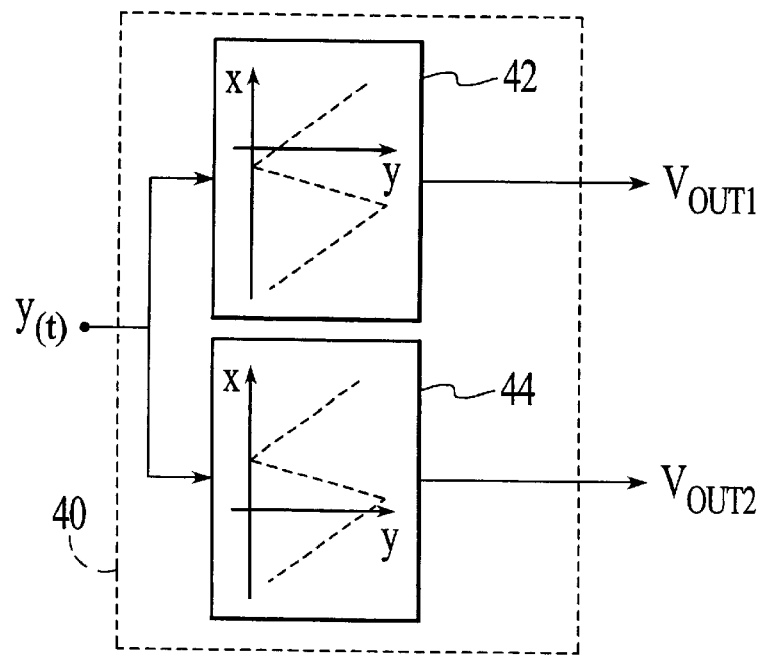
FIG. 4 depicts another illustrative embodiment of the present invention.
Figure 5:
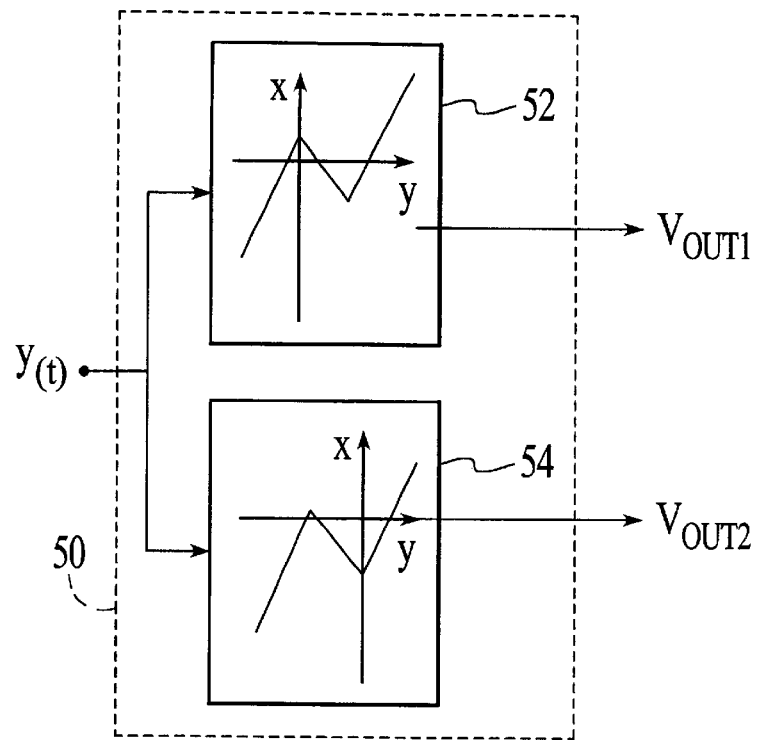
FIG. 5 depicts yet another illustrative embodiment of the present invention.

Referring to FIGS. 4 and 5, illustrative examples of a two-receiver configuration in accordance with this aspect of the invention which can enhance information capacity are shown. The receiver 40 shown in FIG. 4 comprises two receiver circuits 42, 44, each comprising a controlled oscillator with an S-Shaped transfer characteristic and are therefore responsive to the slope of the signal. The state variables for the controlled oscillators are x and y. The first receiver 44 has an unstable region in a portion of the transfer characteristic where $x \geq 0$. Similarly, the second receiver 42 has an unstable region in a portion of the transfer characteristic where $x \leq 0$.

Figure 7:
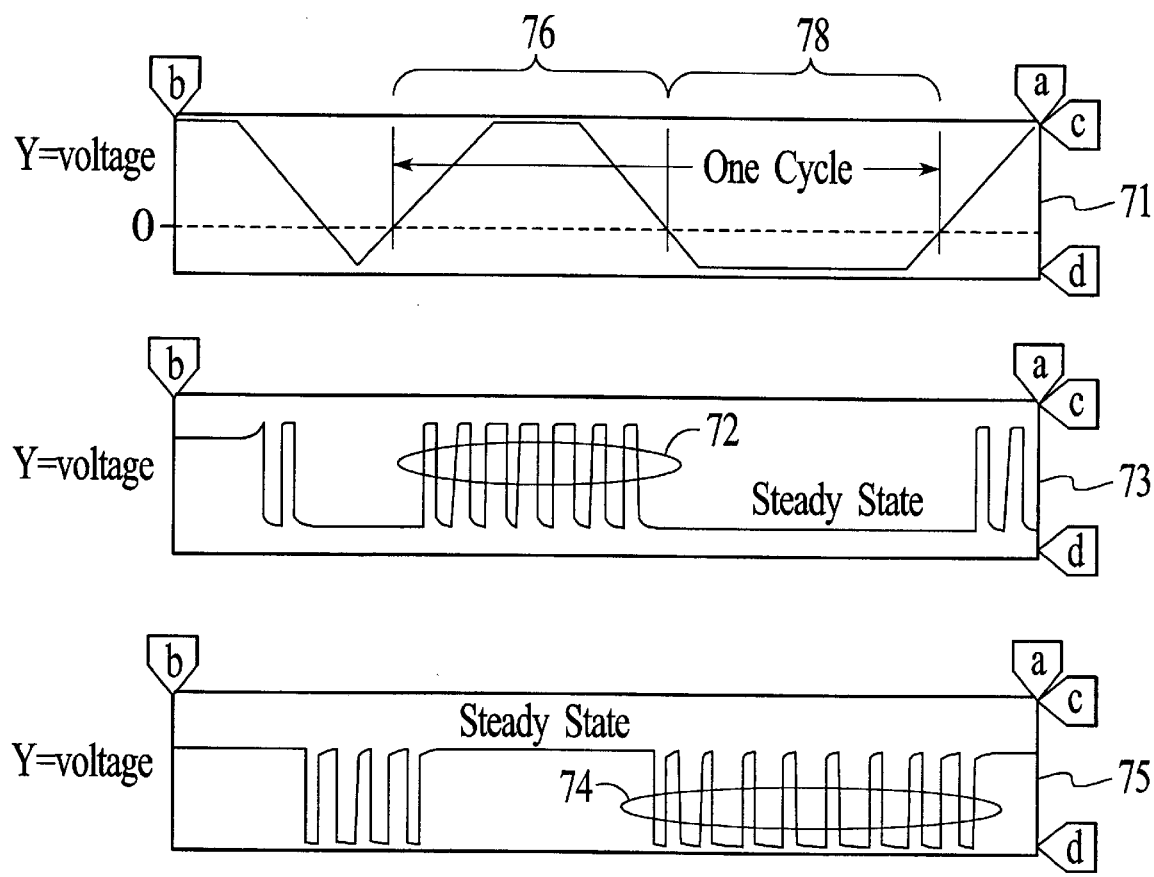
FIG. 7 illustrates that the circuit embodiment of FIG. 6 is capable of carrying two symbols in one cycle of an analog waveform.

An analog waveform can be produced which comprises a first portion and a second portion, both of which can be selected independently of each other. For example, FIG. 7 shows one cycle of a trapezoidal waveform having a positive slope portion of a particular measurement (i.e. slope value), and a negative slope portion of a particular measurement. It can be seen from FIG. 7 that both slope portions can be selected independently of each other. It would be within the scope of one of ordinary skill to piece together other such waveforms.

Continuing in accordance with an embodiment of the invention then, consider a first character and a second character to be sent. A single cycle of an analog waveform is created so that it has a positive-sloped portion having a selected positive slope to represent the first character. The analog waveform also comprises a negative-sloped portion having a selected negative slope to represent the second character. The resultant waveform can be modulated accordingly and transmitted to a demodulator 4 (FIG. 1) to produce a received signal y(t), which is the original analog waveform. The received signal is applied to the receiver 40. Of course, in practice, many such cycles of analog waveforms are created so that continuous signal is produced which is then transmitted.

In the receiver 40, the analog signal is applied to receiver circuits 42, 44. Receiver circuit 42 will respond to the negative slope and produce at its output $V_{out1}$, a group of one or more pulses which represents the first character. Similarly, receiver 44 will respond to the positive slope and produce another group of one or more pulses which represents the second character. Since the waveform portions (i.e., the sloped portions) were selected independently, the two groups of pulses are independent of each other as well. Each group of pulses represents a symbol, and so two independently selected symbols can be transmitted in one cycle of an analog waveform by the present invention.

This single cycle aspect of the invention represents an advance over prior art techniques. Conventional communication systems, in theory, can decode a symbol contained in one cycle of an analog waveform. However, in practice, it can not be done because the demodulator is not fast enough to respond to only one cycle of an analog waveform and decode it to produce a signal. The present invention, therefore, is capable of fast demodulation and higher information capacity.

FIG. 5 depicts another embodiment of a receiver 50 according to this aspect of the invention, comprising two receiver circuits 52, 54. Each receiver circuit in turn includes a controlled oscillator circuit 52, 54 having an N-Shaped transfer characteristic. The state variables for the controlled oscillators are x and y. The first receiver circuit 52 has an unstable region in the region where $y \geq 0$ and the second receiver circuit 54 has an unstable region in the region where $y \leq 0$. The receiver circuits 52, 54 are sensitive to positive and negative amplitude portions of any one cycle of an analog waveform.

Figure 6:
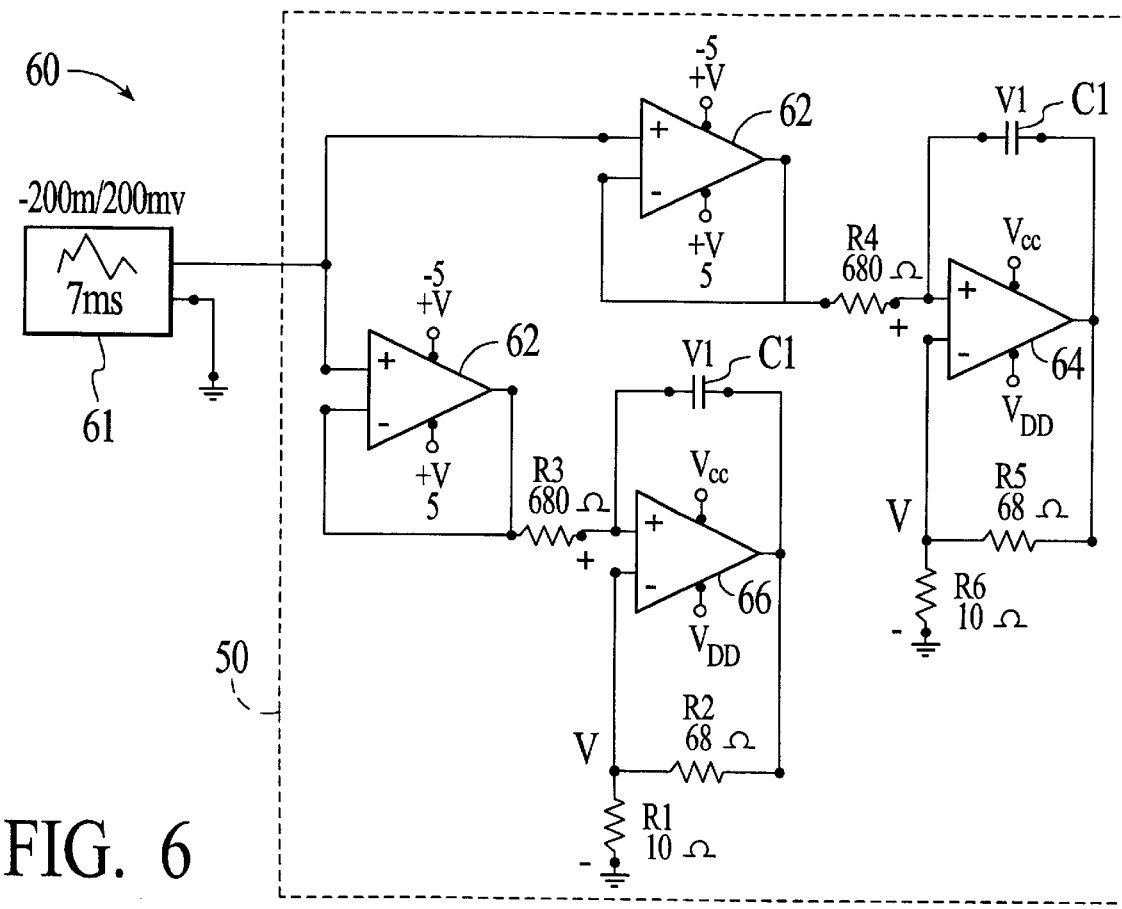
FIG. 6 is a typical circuit realization of the embodiment schematically shown in FIG. 5.

FIG. 6 shows a circuit arrangement for the receiver 50. Receiver circuit 64 comprises an LM 7121 op-amp having a negative feedback path provided via resistive elements R5, R6, arranged in a voltage divider configuration. Resistive element R5 is about 68 Ω and resistive element R6 is about 10 Ω. The op-amp includes a positive feedback path comprising a capacitive element C1 having a capacitance of about 68 nF. The op-amp's $V_{cc}$ pin is set at −1.0 V and its $V_{dd}$ pin is +3.5V. A buffer circuit 62 feeds the input signal via series resistance R4 to the positive input of the op-amp. Receiver circuit 66 is similarly configured, except that the $V_{cc}$ pin of the op-amp in circuit 66 is set at −3.5V, while its $V_{dd}$ pin is set to +1.0V.

Groups of pulses will be generated by receiver 64 in response to positive amplitude portions of the analog waveform while receiver 66 will respond to negative amplitude portions of the analog waveform. If one cycle of an analog waveform comprises positive and negative amplitude portions and each portion can carry one symbol then one cycle of an analog waveform can carry two symbols.

A signal generator 61 was used to simulate the received signal y(t). The output of signal generator is shown in trace 71 in FIG. 7. Traces 73 and 75 show how receivers 64 and 66 respectively respond to one cycle of the analog waveform generated by the signal generator. During a positive going portion 76 of the waveform, receiver 64 responds by producing a first group of pulses 72, while receiver 66 maintains substantially a steady state output. During a negative going portion 78 of the waveform, receiver 66 responds by producing a second group of pulses 74, while receiver 64 maintains substantially a steady state output. The decision device 14 (FIG. 1) then maps the first group of pulses to a symbol (character) and the second group of pulses to a symbol (character). Thus, it can be seen that at least two symbols can be carried by one cycle of analog waveform.

From the foregoing, one can extrapolate the disclosed aspects of the present invention to attain a receiver capable of producing more than two independently selected symbols per cycle of a received waveform. A single cycle of an analog waveform at the transmitting station 2 (FIG. 1) can be shaped accordingly so that there are three (or more) independently selected portions, each portion representing a symbol. At the receiving station, three (or more) groups of pulses are produced by three (or more) receiver circuits in response to sensing the different portions of the analog signal. The groups of pulses feed into the decision device 14 which are mapped or otherwise decoded to reproduce the three symbols.

This invention has been explained with reference to specific illustrative embodiments. Various circuits having resistive input impedances for generating pulses from analog waveforms have been presented. Resistive input impedance is easily matched to other circuits because it is independent of frequency. Hence, broadband matching is not an issue.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Although the present invention has been described in terms of specific embodiments, it should be apparent to those skilled in the art that the scope of the present invention is not limited to the described specific embodiments.

Further, while the present invention has been described using a particular combination of hardware and software, it should be recognized that other combinations of hardware and software are also within the scope of the present invention. The present invention may be implemented only in hardware or only in software or using combinations thereof, depending on performance goals and other criteria not relevant to the invention.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for recovering information from a single cycle of an analog waveform, comprising:
   producing a first group of one or more pulses based on a first portion of said analog waveform;
   producing at least a second group of one or more pulses based on a second portion of said analog waveform; and
   producing at least one symbol based on said first and second groups of pulses.

2. The method of claim 1 further including receiving a transmitted signal and producing said analog waveform from said transmitted signal.

3. The method of claim 1 wherein said producing said first group of one or more pulses includes detecting a first sloped portion of said analog waveform or a first amplitude of said analog waveform.

4. The method of claim 3 wherein said producing said second group of one or more pulses includes detecting a second sloped portion of said analog waveform or a second amplitude of said analog waveform.

5. The method of claim 1 wherein said analog waveform represents a single symbol and said producing at least one symbol includes producing a single symbol based on said first and second groups of pulses.

6. The method of claim 1 wherein said analog waveform represents at least two symbols and said producing at least one symbol includes producing a first symbol based on said first group of pulses and a second symbol based on said second group of pulses.

7. The method of claim 1 wherein said steps are repeated for additional cycles of analog waveforms, thereby producing at least one symbol for each additional cycle of analog waveform.

8. A method for producing information from an analog waveform, said analog waveform having measurements of slope and amplitude, said method comprising:
   detecting a first measurement having a first value and in response thereto producing a first group of one or more pulses;
   detecting a second measurement having a second value and in response thereto producing a second group of one or more pulses; and
   based on said first and second group of pulses, producing at least one symbol.

9. The method of claim 8 wherein said steps of detecting are performed on a single cycle of said analog waveform.

10. The method of claim 8 wherein said producing at least one symbol is a step of producing a single symbol based on said first and second groups of pulses.

11. The method of claim 8 wherein said producing at least one symbol is a step of producing a first symbol based on said first group of pulses and producing a second symbol based on said second group of pulses.

12. The method of claim 11 wherein said analog waveform comprises a first portion selected independently from a second portion, said first measurement relating to said first portion, said second measurement relating to said second portion.

13. A circuit system for recovering information from one cycle of an analog waveform, comprising:
   a first circuit having an input for receiving said analog waveform, said first circuit responsive to a first measurement of said analog waveform by producing a first group of pulses;
   at least a second circuit having an input for receiving said analog waveform, said second circuit being responsive to a second measurement of said analog waveform by producing a second group of one or more pulses; and
   a decoder circuit coupled to receive said first and second pulses respectively from said first and second circuits, said decoder configured to produce at least one symbol based on said first and second pulses.

14. The circuit system of claim 13 further incorporated in a communication system.

15. The circuit system of claim 13 wherein said first measurement is a slope or an amplitude of said analog waveform.

16. The circuit system of claim 15 wherein said second measurement is a slope or an amplitude of said analog waveform.

17. The circuit system of claim 13 wherein said decoder circuit is configured to produce a single symbol based on said first and second groups of pulses.

18. The circuit system of claim 13 wherein said decoder circuit is configured to produce a first symbol based on said first group of pulses and a second symbol based on said second group of pulses.

19. The circuit system of claim 18 wherein said analog waveform comprises at least two symbols, said first symbol being one of said at least two symbols, said second symbol being the another of said at least two symbols.

20. The circuit system of claim 13 wherein said first and second circuits each is characterized by a transfer function having at least one unstable operating region bounded by two stable operating regions.

21. A communication system comprising:
   a transmitter unit including a waveform generator to produce a first cycle of analog waveform;
   a receiver unit adapted to receive said first cycle of analog waveform;
   a first circuit coupled to receive said first cycle of analog waveform, said first circuit responsive to a first measurement of said first cycle of analog waveform by producing a first group of pulses;
   at least a second circuit having an input for receiving said first cycle of analog waveform, said second circuit being responsive to a second measurement of said first cycle of analog waveform by producing a second group of one or more pulses; and
   a decoder circuit coupled to receive said first and second pulses respectively from said first and second circuits, said decoder configured to produce at least one symbol based on said first and second pulses.

22. The system of claim 21 wherein said transmitter further includes modulator to produce a modulated signal containing said first cycle of analog waveform, wherein said modulated signal is transmitted.

23. The system of claim 22 wherein said receiver is operable to receive said modulated signal, said receiver including a demodulator to demodulate said modulated signal to produce said first analog waveform.

24. The system of claim 22 wherein said waveform generator is operable to produce an analog waveform representative of said at least one symbol.

25. The system of claim 21 wherein said first measurement is a slope or an amplitude of said first cycle of analog waveform.

26. The system of claim 25 wherein said second measurement is a slope or an amplitude of said first cycle of analog waveform.

27. The system of claim 21 wherein said decoder circuit is configured to produce a single symbol based on said first and second groups of pulses.

28. The system of claim 21 wherein said decoder circuit is configured to produce a first symbol based on said first group of pulses and a second symbol based on said second group of pulses.

29. The system of claim 21 wherein said first and second circuits each is characterized by a transfer function having at least one unstable operating region bounded by two stable operating regions.

30. The system of claim 21 wherein said waveform generator is configured to produce a cycle of analog waveform having two or more independently selectable portions.

* * * * *